(12) United States Patent
Galamb et al.

(10) Patent No.: US 10,320,205 B2
(45) Date of Patent: Jun. 11, 2019

(54) MONITORING DEVICE AND METHOD FOR MONITORING THE FUNCTIONAL CAPABILITY OF AN ACCUMULATOR FOR ELECTRICAL ENERGY OF A BATTERY AND DISCHARGE DEVICE, BATTERY SYSTEM AND MOTOR VEHICLE

(71) Applicants: Robert Bosch GmbH, Stuttgart (DE); Samsung SDI Co., Ltd., Yongin-si, Gyeonggi-do (KR)

(72) Inventors: Gergely Galamb, Stuttgart (DE); Andreas Bosch, Oberriexingen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 1281 days.

(21) Appl. No.: 13/965,023

(22) Filed: Aug. 12, 2013

(65) Prior Publication Data
US 2014/0042982 A1 Feb. 13, 2014

(30) Foreign Application Priority Data

Aug. 13, 2012 (DE) ........................ 10 2012 214 364

(51) Int. Cl.
*H02J 7/00* (2006.01)
*G01R 31/382* (2019.01)
(Continued)

(52) U.S. Cl.
CPC .......... *H02J 7/0029* (2013.01); *B60L 3/0007* (2013.01); *B60L 3/0046* (2013.01); *B60L 3/0069* (2013.01); *B60L 3/04* (2013.01); *B60L 11/00* (2013.01); *B60L 11/1861* (2013.01); *G01R 31/382* (2019.01); *H01M 10/425* (2013.01); *H01M 10/44* (2013.01); *H01M 10/488* (2013.01); *B60L 2240/36* (2013.01); *B60L 2240/545* (2013.01); *B60L 2240/547* (2013.01); *B60L 2240/549* (2013.01); *B60L 2240/62* (2013.01); *B60L 2250/10* (2013.01); *H01M 2220/20* (2013.01); *Y02T 10/7005* (2013.01); *Y02T 10/705* (2013.01); *Y02T 10/7044* (2013.01); *Y02T 10/7291* (2013.01); *Y02T 90/16* (2013.01); *Y02T 90/162* (2013.01)

(58) Field of Classification Search
USPC .................................................. 320/128–136
See application file for complete search history.

(56) References Cited

U.S. PATENT DOCUMENTS

| | | | |
|---|---|---|---|
| 6,424,157 B1 * | 7/2002 | Gollomp ............. | G01R 31/006 320/132 |
| 2005/0189918 A1 * | 9/2005 | Weisgerber et al. ......... | 320/132 |

(Continued)

FOREIGN PATENT DOCUMENTS

| CN | 101624017 A | 1/2010 |
|---|---|---|
| CN | 101741112 A | 6/2010 |

*Primary Examiner* — Binh C Tat
(74) *Attorney, Agent, or Firm* — Maginot, Moore & Beck LLP

(57) ABSTRACT

In order to monitor a functional capability of an accumulator for electrical energy of a battery, at least one position sensor is provided which outputs a position signal which is representative of the position of the accumulator. If the duration of an incorrect position exceeds a minimum duration, an incorrect position signal is output by a monitoring device.

9 Claims, 2 Drawing Sheets

(51) Int. Cl.
*B60L 11/00* (2006.01)
*B60L 3/00* (2019.01)
*B60L 3/04* (2006.01)
*B60L 11/18* (2006.01)
*H01M 10/42* (2006.01)
*H01M 10/44* (2006.01)
*H01M 10/48* (2006.01)

(56) References Cited

U.S. PATENT DOCUMENTS

| | | | |
|---|---|---|---|
| 2007/0236181 A1* | 10/2007 | Palladino | H01M 10/486 |
| | | | 320/130 |
| 2010/0148582 A1* | 6/2010 | Carter | B60L 11/1861 |
| | | | 307/48 |
| 2013/0015809 A1* | 1/2013 | Frey | B60L 11/1824 |
| | | | 320/106 |
| 2013/0169232 A1* | 7/2013 | Middleton | G01R 31/362 |
| | | | 320/134 |

* cited by examiner

MONITORING DEVICE AND METHOD FOR MONITORING THE FUNCTIONAL CAPABILITY OF AN ACCUMULATOR FOR ELECTRICAL ENERGY OF A BATTERY AND DISCHARGE DEVICE, BATTERY SYSTEM AND MOTOR VEHICLE

This application claims priority under 35 U.S.C. § 119 to patent application no. DE 10 2012 214 364.5, filed on Aug. 13, 2012 in Germany, the disclosure of which is incorporated herein by reference in its entirety.

BACKGROUND

The present disclosure relates to a monitoring device for monitoring the functional capability of an accumulator for electrical energy of a battery. In addition, the present disclosure relates to a method for monitoring the functional capability of an accumulator for electrical energy of a battery. Furthermore, the present disclosure relates to a battery system having a battery and a discharge device. Finally, the present disclosure relates to a discharge device for at least one battery which has at least one accumulator for electrical energy, wherein the accumulator is embodied with two connecting elements which are connected in an electrically conductive fashion to connecting contacts of the battery, wherein the discharge device has a discharging current path for conducting a discharging current between the connecting elements and a discharging switch for closing the discharging current path.

Monitoring devices and methods for monitoring the functional capability of an accumulator for electrical energy of a battery and battery systems having a discharge device and discharge devices are generally known. In addition, motor vehicles which can be driven at least partially or completely electrically and have battery systems for storing drive energy are known. Monitoring devices are often provided in battery management systems and monitor, for example, electrical parameters of at least one accumulator for electrical energy. If the result of the monitoring is that the accumulator is not functionally capable, the accumulator can, for example, be exchanged. In order to be able to exchange the accumulator, the content of electrical energy thereof has to be reduced by the discharge device to such an extent that the accumulator can be exchanged without damage to the battery and without operators being placed at risk.

With the known devices and methods it is also possible to detect damage to the accumulator, with the result that the energy which is contained in the accumulator can be at least reduced in order to avoid resulting damage. However, this damage is detected exclusively on the basis of its effects, for example changing properties of the accumulator. Causes which can lead to damage to the accumulator are not detected.

However, if damage is not detected until it affects the accumulator and the properties thereof, it can, however, be too late to avoid catastrophic resulting damage to the accumulator. For example, the accumulator may overheat greatly and cause fires, for example in the motor vehicle. In addition, the heating of the accumulator can lead to a rise in pressure within the accumulator and to an explosion of the accumulator. In order to prevent the accumulator exploding, a large number of accumulators have pressure valves so that an overpressure can be discharged. However, in this case poisonous gases or liquid acid can escape from the accumulator and damage objects directly or through the formation of explosive flames, or can even injure people.

This resulting damage can occur directly after the appearance of the damage or not until hours, days or weeks later. In addition to damage due to an accident, faults due to transportation or fabrication can also give rise to the specified resulting damage.

SUMMARY

According to the disclosure, a monitoring device of the type mentioned at the beginning is made available which has an incorrect-position-detecting device for detecting an incorrect position of the accumulator, wherein the incorrect-position-detecting device is configured with a memory device for storing the duration of the incorrect position and with a signal device for making available an incorrect position signal, wherein the signal device is designed to make available the incorrect position signal if the duration of the incorrect position is longer than a predefined minimum duration or equal to a predefined minimum duration. In addition, according to the disclosure a method of the type mentioned at the beginning is made available in which the duration of an incorrect position of the accumulator is determined, and when a predefined minimum duration is exceeded an incorrect position signal is made available. Furthermore, according to the disclosure a discharge device of the type mentioned at the beginning is made available which has a monitoring device according to the disclosure, wherein the discharge device is designed to change the discharging switch into its closed state as a function of the incorrect position signal. Furthermore, according to the disclosure a battery system of the type mentioned at the beginning is made available, wherein the discharge device is a discharge device according to the disclosure. Finally, according to the disclosure a motor vehicle of the type specified at the beginning is made available, wherein the battery system is a battery system according to the disclosure.

Incorrect positions of the accumulator can occur, for example, if the motor vehicle in which the accumulator is installed rolls over due to an accident. In the incorrect position, the accumulator is rotated through, for example, 90° or through 180° about a horizontal spatial axis with respect to its normal position or operating position. If the motor vehicle remains in a position other than its normal position, fluids, for example electrolytic fluids, can also escape in the course of time from accumulators with hermetically sealed design, or moisture can penetrate the accumulator. Fluids escaping from the accumulator can give rise to corrosion or short-circuits in the battery and/or in the electrics of the motor vehicle and consequently bring about fires. Fluid which penetrates the cell can react chemically with reactive components of the cell, for example with lithium, which causes the accumulator to burn or to explode. Even if the accumulator is not leaking, fluids of the accumulator can come into contact with electronics arranged in the accumulator due to the incorrect position of the accumulator and in turn lead to short-circuits.

Apart from as a result of an accident, the accumulator can also be arranged in the incorrect position over a relatively long period of time when it is being transported or stored, as a result of which the problems described above can be caused. In this context, brief incorrect positioning of the accumulator is generally not critical, in particular if the fluids are hermetically enclosed within the accumulator. However, incorrect positioning of the accumulator over the minimum time period which is known, for example, from trials can cause the accumulator to leak.

If a certain minimum quantity of electrical energy is stored in the accumulator and short-circuits arise in the course of time, the accumulator may heat up greatly and the abovementioned resulting damage can come about. In order to avoid the resulting damage, the accumulator is at least partially or completely discharged as soon as the incorrect position signal is made available. In order to discharge the accumulator, the discharge device closes the discharging switch as a function of the incorrect position signal. The electrical energy of the accumulator is extracted in the form of a discharging current, and in particular the accumulator is discharged via a discharging resistor which is arranged in the discharging current path.

The accumulator can be discharged in a controlled manner through the automatic closing of the discharging switch or the automatic discharging of the accumulator as a function of the incorrect position signal, before short-circuits which come about in the course of time can cause the accumulator to heat up greatly or even explode. Even if the accumulator were to be disconnected from the connecting contacts of the battery owing to an accident, the accumulator can nevertheless discharge safely since the discharging current path runs directly between the connecting elements of the accumulator.

The disclosure can be improved further by various configurations which are each advantageous per se and can be combined with one another as desired. Details are given below of these embodiments and of the advantages associated therewith.

According to a first embodiment, the monitoring device and, in particular, the incorrect-position-detecting device can have at least one position sensor for detecting the incorrect position. If the position of the accumulator differs from its normal position or operating position by a predefined minimum amount, the position sensor can detect the incorrect position and output a measurement signal which represents the incorrect position.

However, with just one position sensor there is the risk of the position sensor not detecting all the incorrect positions. Many position sensors detect, for example, incorrect positions in which the accumulator is tilted through 90° with respect to the operating position only if the accumulator is tilted about a specific horizontal spatial axis. Tilting or rotation about a horizontal spatial axis which is arranged at a right angle with respect to this spatial axis is not detected by these position sensors. Consequently, it is particularly advantageous if two position sensors are provided, each of which detects incorrect positions about one of the two horizontal spatial directions which are arranged perpendicularly with respect to one another. Even if the position sensors can detect tilting about any horizontal spatial axes, two position sensors ensure increased safety compared to merely one position sensor for reasons of redundancy.

The position sensor can be embodied as an acceleration sensor which detects accelerations of the magnitude of the acceleration due to gravity. Since the position sensor is only intended to detect incorrect positions and no other mechanical events, the position sensor can therefore be made simple and economical. For example, the position sensor can be a capacitive acceleration sensor with a measuring range of ± twice the acceleration due to gravity. The position sensor may be what is referred to as a MEMS sensor, that is to say a micro-electrical-mechanical system which, where possible, is a surface-micro-mechanical, statically sensing, low-g acceleration sensor. The position sensor preferably has a zero point stability of ±5% of the acceleration of the earth, or less, in its operating temperature range and over its service life.

According to a further advantageous embodiment, the position sensor can be configured so as to be capable of being attached to a housing part of the accumulator. Although it may be sufficient to attach the position sensor to any component of the battery or of the motor vehicle in order to be able to detect incorrect positions of the entire system of the battery or the entire system of the motor vehicle, this does not allow incorrect positions of the accumulator to be detected during its manufacture or transportation. In addition, owing to an accident it may be possible that the accumulator becomes detached from mechanical attachments within the battery and after an accident is arranged in an incorrect position even though the motor vehicle or the battery is arranged in its operating position. The position sensor may be designed, for example, to latch with a housing part and, in particular, a lid of the accumulator. Alternatively, the position sensor can be capable of being bonded to the housing part or welded or secured in some other way to the housing part.

The monitoring device can have a display device which outputs a warning signal which is representative of a potential incorrect position of the accumulator. In this context, the display device can be connected in a signal-transmitting fashion to the incorrect-position-detecting device and/or to the signal device thereof, and can output the warning signal as a function of the incorrect position signal.

However, if the incorrect position occurs owing to an accident, there is the risk of the connection between the signal device and the display device tearing off. Consequently, according to an advantageous embodiment the display device can be additionally or alternatively constructed so as to be connectable in a signal-transmitting fashion to an external signal source and output, as a function of a signal of the external signal source, a warning signal which is representative of a potential incorrect position of the accumulator. The external signal source may be a sensor device for an airbag of the motor vehicle here. Triggering of the airbag by the external signal source can be interpreted by the display device as an event which potentially brings about an incorrect position of the accumulator. Consequently, in such a case the display device outputs the warning signal independently of the actual position of the accumulator.

Alternatively or additionally to the at least one position sensor, the incorrect-position-detecting device can also be embodied so as to be connectable in a signal-transmitting fashion to the external signal source, and can make available the incorrect position signal as a function of the signal of the external signal source.

According to another advantageous embodiment, the discharging switch can be a pyro-electric switch with a firing element which changes the discharging switch into its closed switched position. The incorrect position signal, or a control signal which depends on the incorrect position signal, can be fed to the firing element, and the firing element can fire as a function of the incorrect position signal and thereby change a switching element of the pyro-electric switch into the closed switched position in order to close the discharging current path between the connecting elements of the accumulator. The firing element also drives the switching element of the discharging switch safely into the closed switched position when as a result of the accident accelerations occur which counteract the movement of the switching element into the closed switched position.

The discharging switch can be designed to switch safely and, where possible, repeatedly discharging currents of, for example, 1000 A at 100 V. In addition, the discharging switch can be configured with a display element which displays the closed switched state of the discharging switch.

The discharging switch can be a monostable switch with a stable, closed switched position. If the discharging switch is closed once the accumulator for electrical energy will automatically discharge up to a predefined level, or even completely. The discharging switch can have a latching element which holds the discharging switch in its closed switched position. For example, the latching element can be arranged on the switching element or on a securing element for the switching element of the discharging switch. Mechanical securing of the discharging switch in its closed switched position functions independently of an energy supply of the discharging switch and therefore ensures in a particularly reliable way the closed switched position of the discharging switch.

Manual opening of the discharging switch, for example by the driver of the vehicle, is preferably not provided. However, there may optionally be the possibility of the discharging switch being reset by a service technician into its closed switched position, for example after the accumulator for electrical energy has been checked.

The discharging current path can have a discharging resistor which is connected in series with the discharging switch, wherein the connecting elements can be connected to one another with the discharging resistor in an electrically conductive fashion via the discharging switch. In order to avoid overloading of the battery system which is damaged where possible, only the discharging current can be extracted from the accumulator for electrical energy, wherein the discharging current is preferably smaller than or equal to the maximum operating current which can be drawn from the accumulator. In particular, the discharging resistor can be selected such that it can conduct discharging currents of, for example, up to 1000 A at 100 V and reliably conduct away waste heat which is generated.

Depending on the battery system, the discharging resistor can be of different designs. In particular, the discharging resistor can limit the discharging current to the maximum operating current which can be drawn from the accumulator, or less. For example, the discharging resistor can have a resistance value which corresponds to a permissible load resistance of the accumulator. For example, the discharging resistor can correspond to the electrical resistor of an electric motor, for example a drive motor of the motor vehicle, or an actuating motor of a wing of a wind turbine, wherein the battery system can supply the motor vehicle or the wind turbine at least partially with drive energy or with operating energy.

According to a further advantageous embodiment, the discharge device can have a switch controller for controlling the discharging switch, wherein the switch controller is connected to the discharging switch in a control-signal-transmitting fashion. The control signal can correspond here to the incorrect position signal or be made available by the switch controller as a function of said incorrect position signal. The switch controller is preferably integrated into a battery management system of the battery system in order, as a result, to reduce the complexity of the battery system. Alternatively, the switch controller can also be embodied separately, and in particular independently, of the battery management system, in order to avoid transmission of incorrect states of the battery management system to the switch controller. This increases the safety of the battery system further.

The accumulator can be a battery cell, a battery module which comprises at least one battery cell or a battery subunit which has at least one battery module. In particular, the embodiment of the accumulator as a battery cell increases the safety of the battery system to a maximum extent since the battery cell can, as the smallest accumulator for electrical energy of the battery, therefore be discharged independently of other elements of the battery system and according to requirements.

The battery system can have a plurality of accumulators for electrical energy which are connected to one another in series or in parallel. Each of the accumulators can be equipped with the discharge device.

The battery system can have at least one battery cell on a lithium-ion basis and preferably at least one lithium-ion battery cell.

BRIEF DESCRIPTION OF THE DRAWINGS

The disclosure will be explained by way of example below by means of exemplary embodiments and with reference to the drawings. The different features of the embodiments can be combined independently of one another here, as has already been stated with respect to the individual advantageous embodiments. In the drawings.

DETAILED DESCRIPTION

Firstly, the design and function of a battery system according to the disclosure will be described with reference to the exemplary embodiment in FIG. 1.

Figure 1:
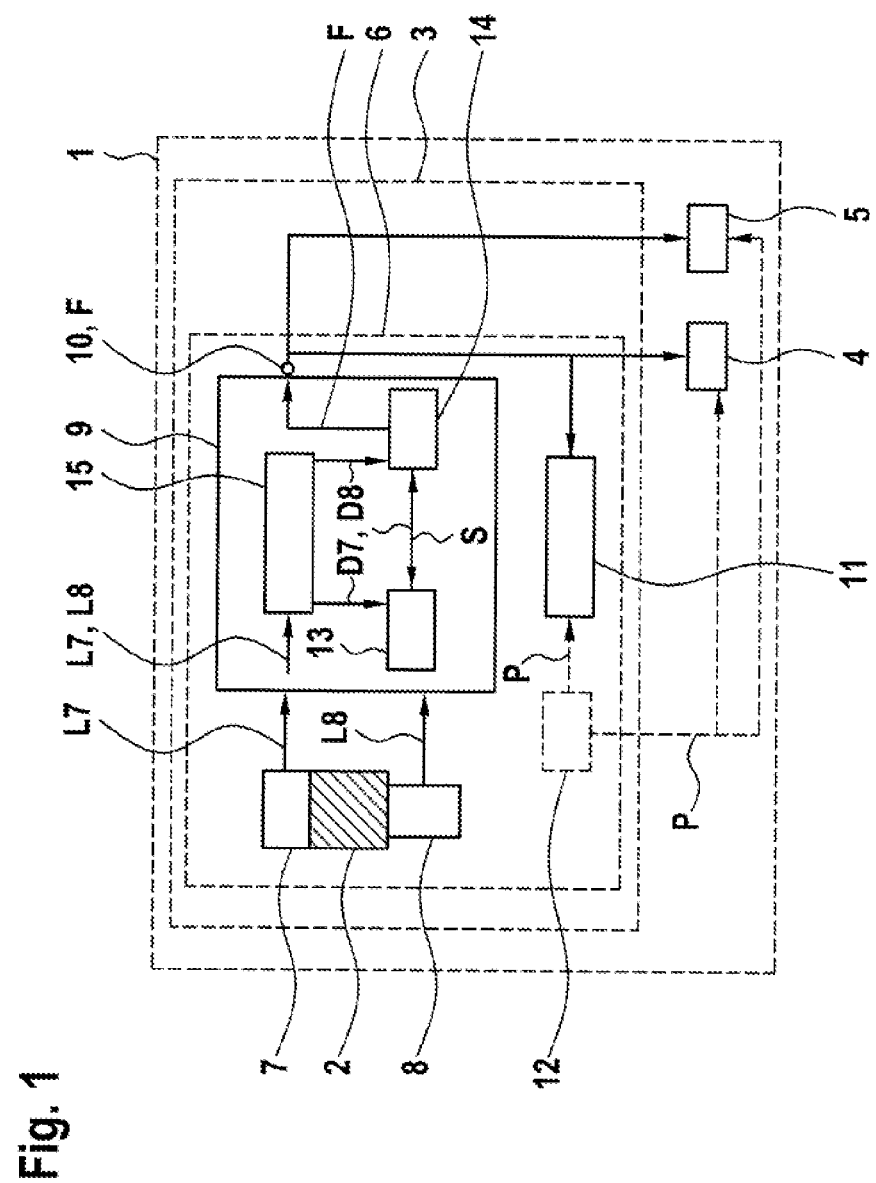
FIG. 1 shows a schematic illustration of an exemplary embodiment of a battery system according to the disclosure.

FIG. 1 shows the battery system 1 with an accumulator 2 for electrical energy, a monitoring device 3 for monitoring the functional capability of the accumulator 2, a warning display 4 and a discharge device 5.

The accumulator 2 for electrical energy is, for example, a battery cell, in particular a battery cell which is based on lithium technology, preferably a lithium-ion battery cell, a battery module which comprises at least one battery cell, a battery subunit which comprises at least one battery module, or a battery. The monitoring device 3 is, for example, a battery management system with which properties of the accumulator 2 can be monitored. The warning display 4 can be mounted in an instrument panel of a motor vehicle or in such a way that it can be viewed from the outside on the battery system 1 or on the accumulator 2. The discharge device 5 is preferably designed to discharge the accumulator 2 at least partially or completely when required.

The monitoring device 3 is shown embodied with an incorrect-position-detecting device 6. Alternatively, the incorrect-position-detecting device 6 can be embodied independently of the monitoring device 3. The incorrect-position-detecting device 6 comprises at least one, and preferably two, position sensors 7, 8, which are as illustrated in the exemplary embodiment in FIG. 1, are embodied in such a way that they can be provided on the accumulator 2 and are fastened to the accumulator 2 in the exemplary embodiment in FIG. 1. The position sensors 7, 8 are arranged rotated through 90° relative to one another, in order to be able to detect different positions of the accumulator 2.

In addition, the incorrect-position-detecting device 6 has a control device 9 which is connected in a signal-transmitting fashion to the position sensors 7, 8, and to which a position signal L7, L8 is fed by each of the position sensors 7, 8. In the control device 9, at least one of the position signals L7, L8 is compared, for example, with a setpoint position signal which represents the setpoint position of the accumulator 2, and on the basis of a result of this comparison an incorrect position signal F is made available to a signal output 10 of the control device 9. In particular, the incorrect position signal F is made available if one of the position signals L7, L8 deviates from the setpoint position signal over a predefined minimum period and by a predetermined minimum absolute value.

The signal output 10 of the control device 9 is connected in a signal-transmitting fashion to the warning display 4 and the discharge device 5. If the warning display 4 is not provided on the battery system 1 or on the accumulator 2, the incorrect-position-detecting device 6 can have a display device 11 which is connected in a signal-transmitting fashion to the signal output 10. The warning display 4 and the display device 11 can be designed to output, as a function of the incorrect position signal F, a warning signal which is representative of the incorrect position of the accumulator 2.

Alternatively or additionally, the warning display 4 and/or the display device 11 can be connected in a signal-transmitting fashion to an external signal source 12. The external signal source 12 is, for the sake of simplicity, illustrated as part of the incorrect-position-detecting device 6. Alternatively, the external signal source 12 can, however, also be embodied separately from the incorrect-position-detecting device 6 and can be, for example, a signal source 12 of the motor vehicle. The position signals L7, L8 are not fed to the external signal source 12. Consequently, the external signal source 12 can output just one signal P which is representative of a potential incorrect position of the accumulator 2. The external signal source 12 conducts, for example, a sensor signal of an airbag sensor of the motor vehicle or a signal P, representative of this sensor signal, to the warning display 4 and/or the display device 11. Alternatively or additionally, the external signal source 12 can also be connected in a signal-conducting fashion to the discharge device 5, and can output the signal P to the discharge device 5. The external signal source 12 can output the signal P after an accident to the motor vehicle, and in particular after the airbag has been triggered.

The control device 9 is illustrated with a memory device 13 which has a data memory, a signal device 14 which makes available the error signal F, and an analog/digital converter 15. The position signals L7, L8 are fed to the analog/digital converter 15. The analog/digital converter 15 converts at least one of the position signals L7, L8 into data signals D7, D8 and outputs the latter to the memory device 13 and/or the signal device 14.

The incorrect position signal F is output if the duration of the incorrect position of the accumulator 2 reaches or exceeds the predetermined minimum duration. In order to determine the duration of the incorrect position, the memory device 13 can have a defined memory area. The size of the defined memory area can represent the permissible minimum duration of the incorrect position. If the memory area is completely filled with data signals D7, D8, the memory device 13 can output a signal S to the signal device 14 which as a result makes available the error signal F. Alternatively, the data signals D7, D8 can be conducted via the signal device 14 to the memory device 13. In the memory device 13, attainment of the minimum duration can be monitored on the basis of the predefined memory area. Alternatively, the signal device 14 can determine the duration of the incorrect position and store a data record, representative of the attainment of the predefined minimum duration, in the memory device 13. In addition, the signal device 14 can conduct the data signals D7, D8 to the memory device 13 for documentation purposes. For this purpose, the data memory can be a nonvolatile memory which retains the stored data even after failure of supply energy.

Figure 2:
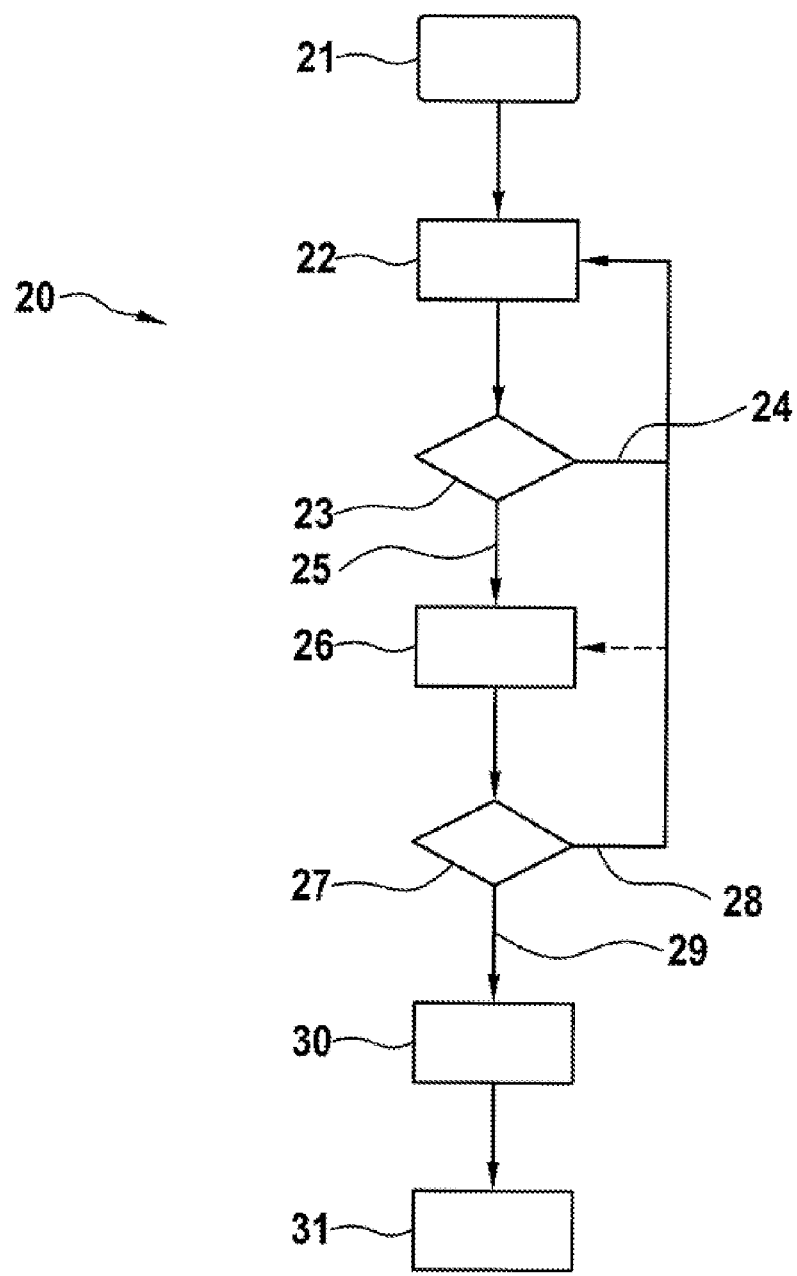
FIG. 2 shows a schematic illustration of an exemplary embodiment of the method according to the disclosure, as a flow chart.

FIG. 2 shows the method 20 according to the disclosure in a schematic form as a flowchart. The same reference symbols are used for elements which correspond in their design or function to the elements of the exemplary embodiment in FIG. 1. In a first method step 21, the method 20 starts. In a method step 22 following the method step 21, at least one of the position signals L7, L8 is determined. In the following method step 23 it is checked whether one or, where possible, both position signals L7, L8 represent an incorrect position of the accumulator 2. If both position signals L7, L8 represent a normal operation position of the accumulator 2, the method is continued in step 22, as indicated by the arrow 24. If just one position sensor 7, 8 is provided, it is, of course, sufficient if the position signal L7, L8 of this one position sensor 7, 8 represents the normal operating position of the accumulator 2.

If one of the position signals L7, L8 represents an incorrect position of the accumulator 2, the method is continued in method step 26 as represented by the arrow 25. In the method step 26, the duration of the incorrect position and in particular the duration of the uninterrupted incorrect position are determined. On the basis of the determined duration of the incorrect position, it is checked in the method step 27 following the method step 26 whether the duration of the incorrect position has reached or exceeded the predetermined minimum duration. If the minimum duration has not yet been reached or exceeded, the method is, as indicated by the arrow 28, continued in the method step 22 or alternatively in the method step 26. However, if the minimum duration has been reached or exceeded, the method is continued in the method step 30, as indicated by the arrow 29. The incorrect position signal F is made available in the method step 30.

In the method step 31 which follows the method step 30, a warning signal is output and/or the accumulator 2 is at least partially or completely discharged.

What is claimed is:

1. A monitoring device for monitoring a functional capability of an accumulator for electrical energy of a battery, the accumulator including an electrolytic fluid and two connecting elements which are connected in an electrically conductive fashion to connecting contacts of the battery, the monitoring device comprising:
   an incorrect-position-detecting device configured to detect an incorrect position of the accumulator, the incorrect position being any position at which the electrolytic fluid could leak from the accumulator or come into contact with electronics arranged in the accumulator, the incorrect-position-detecting device including a memory device configured to store a duration of the incorrect position; and
   a signal device configured to make available an incorrect position signal if (i) the duration of the incorrect position is longer than a predetermined minimum duration, or (ii) the duration of the incorrect position is equal to the predetermined minimum duration, and wherein:
the monitoring device is included in a discharge device for the battery, the discharge device including the accumulator,
the discharge device defines a discharging current path configured to conduct a discharging current between the two connecting elements
the discharge device includes a discharging switch configured to close the discharging current path, and
the discharge device is configured to change the discharging switch into a closed state as a function of the incorrect position signal.

2. The monitoring device according to claim 1, further comprising:
at least one position sensor configured to detect the incorrect position of the accumulator.

3. The monitoring device according to claim 2, wherein the at least one position sensor includes an acceleration sensor configured to detect accelerations of a magnitude of an acceleration due to gravity.

4. The monitoring device according to claim 2, wherein:
the accumulator includes a housing part, and
the at least one position sensor is configured so as to be capable of being attached to the housing part.

5. The monitoring device according to claim 1, further comprising:
a display device configured (i) to be connectable in a signal-transmitting fashion to an external signal source, and (ii) to output a warning signal, as a function of a signal of the external signal source, the warning signal being representative of a potential incorrect position of the accumulator.

6. A battery system comprising:
a battery including connecting contacts; and
a discharge device including (i) an accumulator for electrical energy of the battery, a monitoring device configured to monitor a functional capability of the accumulator, and (iii) a discharging switch,
wherein the accumulator includes an electrolytic fluid and two connecting elements which are connected in an electrically conductive fashion to the connecting contacts of the battery,
wherein the monitoring device includes
an incorrect-position-detecting device configured to detect an incorrect position of the accumulator, the incorrect-position-detecting device including a memory device configured to store a duration of the incorrect position, the incorrect position being any position at which the electrolytic fluid could leak from the accumulator or come into contact with electronics arranged in the accumulator, and
a signal device configured to make available an incorrect position signal if (i) the duration of the incorrect position is longer than a predetermined minimum duration, or (ii) the duration of the incorrect position is equal to the predetermined minimum duration,
wherein the discharge device defines a discharging current path configured to conduct a discharging current between the two connecting elements,
wherein the discharging switch is configured to close the discharging current path, and
wherein the discharge device is configured to change the discharging switch into a closed state as a function of the incorrect position signal.

7. The battery system according to claim 6, wherein the battery system is connected to a drive system of a motor vehicle in such a way as to supply energy.

8. A method for monitoring a functional capability of an accumulator for electrical energy of a battery, the accumulator including an electrolytic fluid and two connecting elements which are connected in an electrically conductive fashion to connecting contacts of the battery, the method comprising:
determining a duration of an incorrect position of the accumulator using a monitoring device, the incorrect position being any position at which the electrolytic fluid could leak from the accumulator or come into contact with electronics arranged in the accumulator; and
making available an incorrect position signal using a monitoring device when a predefined minimum duration is exceeded; and
changing a discharging switch of a discharge device into a closed state as a function of the incorrect position signal, the discharge device defining a discharging current path configured to conduct a discharging current between the two connecting elements, the discharge switch being configured to close the discharging current path in the closed state,
wherein the monitoring device includes
an incorrect-position-detecting device configured to detect an incorrect position of the accumulator, the incorrect-position-detecting device including a memory device configured to store a duration of the incorrect position, the incorrect position being any position at which the electrolytic fluid could leak from the accumulator or come into contact with electronics arranged in the accumulator, and
a signal device configured to make available an incorrect position signal if (i) the duration of the incorrect position is longer than a predetermined minimum duration, or (ii) the duration of the incorrect position is equal to the predetermined minimum duration.

9. The method according to claim 8, further comprising:
outputting a warning signal that represents a potential incorrect position of the accumulator.

* * * * *